United States Patent
Mueller et al.

(10) Patent No.: US 10,715,796 B2
(45) Date of Patent: Jul. 14, 2020

(54) METHOD AND DEVICE FOR MONITORING AN IMAGE SENSOR

(71) Applicant: Robert Bosch GmbH, Stuttgart (DE)

(72) Inventors: Bernd Mueller, Leonberg (DE); Uwe Beutnagel-Buchner, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/341,722

(22) PCT Filed: Sep. 12, 2017

(86) PCT No.: PCT/EP2017/072834
§ 371 (c)(1),
(2) Date: Apr. 12, 2019

(87) PCT Pub. No.: WO2018/082836
PCT Pub. Date: May 11, 2018

(65) Prior Publication Data
US 2020/0053353 A1 Feb. 13, 2020

(30) Foreign Application Priority Data
Nov. 2, 2016 (DE) .......................... 10 2016 221 441

(51) Int. Cl.
*H04N 17/00* (2006.01)
*H04N 5/335* (2011.01)

(52) U.S. Cl.
CPC .......... *H04N 17/002* (2013.01); *H04N 5/335* (2013.01)

(58) Field of Classification Search
CPC .............................. H04N 17/002; H04N 5/335
USPC ........................................................ 348/187
See application file for complete search history.

(56) References Cited

U.S. PATENT DOCUMENTS

| | | | |
|---|---|---|---|
| 7,085,408 B1 * | 8/2006 | Chung-Chi Jim | H04N 5/335 250/208.1 |
| 2008/0158363 A1 | 7/2008 | Myers | |
| 2013/0113958 A1 * | 5/2013 | Chen | H04N 5/3572 348/223.1 |
| 2015/0244948 A1 * | 8/2015 | Boorom | H04N 5/357 348/241 |
| 2015/0281684 A1 * | 10/2015 | Beck | H04N 17/045 348/175 |

(Continued)

FOREIGN PATENT DOCUMENTS

| | | |
|---|---|---|
| GB | 2334848 A | 9/1999 |
| WO | 9104498 A1 | 4/1991 |

(Continued)

OTHER PUBLICATIONS

International Search Report for PCT/EP2017/072834, dated Dec. 5, 2017.

*Primary Examiner* — Michael Lee
(74) *Attorney, Agent, or Firm* — Norton Rose Fulbright US LLP; Gerard Messina

(57) ABSTRACT

A method for monitoring an image sensor, the image sensor having a communication interface for communicating with an external monitoring unit. In the method, a request signal generated by the monitoring unit is read in via the communication interface, a test pattern generated by the image sensor is modified using the request signal, and the modified test pattern is output to the communication interface, in order to have the modified test pattern evaluated by the monitoring unit.

11 Claims, 2 Drawing Sheets

(56) References Cited

U.S. PATENT DOCUMENTS

2016/0301923 A1 10/2016 Ichige
2017/0113512 A1* 4/2017 Park ..................... B60J 7/057

FOREIGN PATENT DOCUMENTS

| WO | 2004045912 A1 | 6/2004 |
| WO | 2006087628 A1 | 8/2006 |

* cited by examiner

METHOD AND DEVICE FOR MONITORING AN IMAGE SENSOR

FIELD

The present invention relates to a device and a method for monitoring an image sensor. The present invention also relates to a computer program for monitoring an image sensor.

BACKGROUND INFORMATION

Video-based systems in motor vehicles may be used for safety-related functions. In this context, an image sensor may be used to digitize optical information, while a microprocessor takes over the further processing of the digitized images.

Various conventional methods for the internal monitoring of such an image sensor include, for example, memory protection via parity or ECC or the use of dedicated configurations-CRC or counter.

SUMMARY

The present invention provides an example method for monitoring an image sensor, an example device which uses this method, and finally a corresponding computer program. Advantageous further developments of and improvements to the example device in accordance with the present invention are described herein.

An example method in accordance with the present invention for monitoring an image sensor, the image sensor having a communication interface for communicating with an external monitoring unit, the method including, for example, the following steps:

Read-in of a request signal, generated by the monitoring unit, via the communication interface;

Modification of a test pattern, generated by the image sensor, using the request signal, in order to obtain a modified test pattern; and Output of the modified test pattern to the communication interface, in order to have the modified test pattern evaluated by the monitoring unit.

For instance, an image sensor may be understood to be a CCD or CMOS sensor. An external monitoring unit may be understood to be a processing unit, for example, in the form of a microcontroller or microprocessor. A request signal may be understood to be a challenge, that is, a query or task in the form of a corresponding bit pattern. Depending on the specific embodiment, a test pattern may be understood to be a test-pattern portion of an image generated by the image sensor, for instance, at least one line or column of the image, or a separate test image. In order to generate the test pattern, for example, the image sensor may add several image lines or image columns as the test pattern to an image. The modified test pattern may be a response, that is, a reply to the challenge in the form of a corresponding reply bit pattern. For example, based on the request signal, the image sensor may carry out internal measures such as calculations, for instance, which result in the generation of the response in the form of a modification of the test pattern. This response may be sent back to the monitoring unit, which knows or is able to generate the only correct response, and be checked by it.

The approach presented here is based on the recognition that external monitoring of an image sensor may be realized on the basis of a challenge-response method in which, e.g., a microcontroller or microprocessor is able to transmit challenges to the image sensor. A typical response-generation may be expanded by such a method, by dynamically altering a test-pattern portion of images as a function of the challenge sent in each case. Thus, monitoring of the image sensor may be improved, and a higher level of safety such as a higher ASIL (ASIL=Automotive Safety Integrity Level) may be reached.

The advantage of the approach presented here lies in the external monitoring of the image sensor, as the external monitoring permits safety argumentation concerning the use of a plurality of components. Overall monitoring of the active chain is thereby made possible even for higher application layers in the image processing.

According to one specific embodiment, in the output step, the modified test pattern may be output as part of an image generated by the image sensor. It may thereby be ensured that the modified test pattern is output in time with the image generated by the image sensor.

According to a further specific embodiment, in the modification step, the modified test pattern may be generated piece by piece. Correspondingly, pieces of the modified test pattern may be output in the output step. For instance, the modified test pattern may be generated line by line or column by column, or both line by line and column by column. For example, in the output step, the pieces of the modified test pattern may be output synchronously with an image-transmitting clock pulse of the image sensor. This specific embodiment makes it possible to dispense with buffer memory for storing the modified test pattern temporarily.

In addition, it is advantageous if in the modification step, the modified test pattern is generated sequentially starting from a start value, using a processing specification. For example, a processing specification may be understood to be a logic such as a state machine, also called finite state machine or finite automaton. A start value may be understood to be a seed value of the logic, for instance. The modified test pattern may thereby be generated particularly efficiently.

Moreover, the method may include a step of generating the request signal, subject to an image-transmitting clock pulse of the image sensor. In this way, the image sensor may be monitored with high efficiency.

In this connection, in the generating step, the request signal may be generated synchronously with the image-transmitting clock pulse. For example, the request signal may be generated for each individual image generated by the image sensor. Alternatively, the request signal may also be generated, e.g., for each nth image generated by the image sensor. The efficiency of the image-sensor monitoring may be further increased by this specific embodiment.

It is also advantageous if in an evaluation step, the modified test pattern is evaluated, e.g., using the request signal. In this context, the image sensor may be deactivated in a deactivation step if the modified test pattern is recognized repeatedly as incorrect during the evaluation. In this way, it is possible to prevent a one-time false generation of a test pattern from leading to an immediate shutdown of the image sensor.

According to a further specific embodiment, using the request signal, at least one further reply signal may be output in the output step, in order to have the further reply signal evaluated by the monitoring unit, as well. The further reply signal may be an additional response. The reliability of the method may thereby be increased.

It is advantageous if in the output step, the further reply signal is output using at least one safety mechanism of the image sensor. A safety mechanism may be understood to be a mechanism for the self-testing of the image sensor. Depending on the style, the image sensor may have a multitude of different safety mechanisms. The safety mechanism may thereby be integrated into the generation of the response in the form of the modified test pattern. Thus, an especially high monitoring quality may be achieved.

In addition, the method may include a step of checking an operational capability of the monitoring unit, using the modified test pattern. In this manner, the modified test pattern may be used additionally for monitoring the monitoring unit.

For example, this method may be implemented in software or hardware or in a mixed form of software and hardware, e.g., in a control unit.

The approach introduced here also provides a device which is designed to carry out, control or implement the steps of a variant of a method presented here, in suitable units. The object of the present invention may be achieved quickly and efficiently by this embodiment variant of the invention in the form of a device, as well.

To that end, the example device may have at least one arithmetic logic unit for the processing of signals or data, at least one memory unit for storing signals or data, at least one interface to a sensor or an actuator for reading in sensor signals from the sensor or for the output of data signals or control signals to the actuator and/or at least one communication interface for the read-in or output of data which are embedded into a communication protocol. The arithmetic logic unit may be a signal processor, a microcontroller or the like, for example, while the memory unit may be a flash memory, an EPROM or a magnetic memory unit. The communication interface may be adapted to read in or output data in wireless and/or line-conducted fashion, a communication interface which is able to read in or output line-conducted data having the capability to read in this data electrically or optically from a corresponding data-transmission line, for example, or to output it into a corresponding data-transmission line.

In the present case, a device may be understood to be an electrical device which processes sensor signals and outputs control signals and/or data signals as a function thereof. The device may have an interface which may be implemented in hardware and/or software. If implemented in hardware, the interfaces may be part of what is referred to as a system ASIC, for example, that includes a wide variety of functions of the device. However, it is also possible that the interfaces are separate integrated circuits or are made up at least partially of discrete components. If implemented in software, the interfaces may be software modules which are present on a microcontroller, for example, in addition to other software modules.

In one advantageous development of the present invention, the vehicle is controlled by way of the device. To that end, for example, the device is able to access sensor signals such as acceleration signals, pressure signals, steering-angle signals or driving-environment sensor signals. The control is carried out via actuators such as braking or steering actuators or an engine control unit of the vehicle.

Of advantage is also a computer-program product or computer program having program code that may be stored on a machine-readable carrier or storage medium such as a semiconductor memory, a hard disk memory or an optical memory and is used to carry out, implement and/or control the steps of the method according to one of the specific embodiments described above, especially when the program product or program is executed on a computer or a device.

Exemplary embodiments of the present invention are represented in the figures and explained in greater detail below.

DETAILED DESCRIPTION OF EXAMPLE EMBODIMENTS

Figure 1:
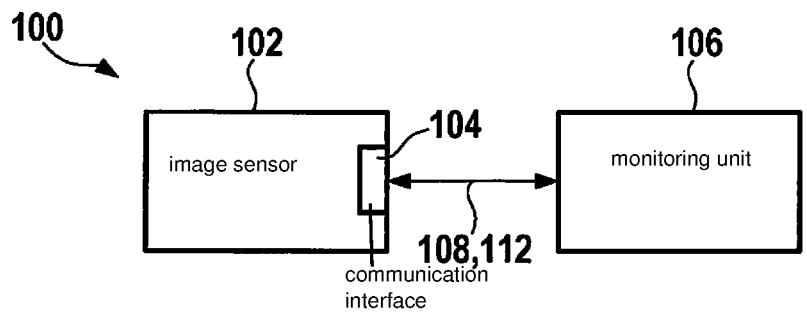
FIG. 1 shows a schematic representation of a device according to one exemplary embodiment.

In the following description of advantageous exemplary embodiments of the present invention, the same or similar reference numerals are used for the similarly functioning elements shown in the various figures, a description of these elements not being repeated.

FIG. 1 shows a schematic representation of a device 100 according to one exemplary embodiment. Device 100 includes an image sensor 102 having a communication interface 104, which is coupled to a monitoring unit 106 for monitoring image sensor 102. For example, monitoring unit 106, e.g., a microcontroller or microprocessor, is designed to generate a request signal 108, also called challenge, and to transmit it to communication interface 104. Image sensor 102 is designed to read in request signal 108 and to process it in order to modify a test pattern generated by image sensor 102. The modification is carried out here as a function of a bit pattern represented by request signal 108. The test pattern thus modified may therefore also be referred to as response, image sensor 102 sending the modified test pattern in the form of a corresponding reply signal 112 via communication interface 104 back to monitoring unit 106. Monitoring unit 106 uses reply signal 112 to check the operational capability of image sensor 102, by analyzing the modified test pattern.

Image sensor 102 is designed, for example, for the digital acquisition of light. In this context, monitoring unit 106 may be realized as hardware for higher image-processing layers. For example, image sensor 102 and monitoring unit 106 are connected to each other by a possibly multipart communication system, communication interface 104 being able to be part of the communication system. Depending on the exemplary embodiment, the communication system includes an I2C bus or MIPI bus or further communication links. A typical functional scenario is that, for instance, upon the start of the system, monitoring unit 106 sends configuration data to image sensor 102, in order to configure it. During operation, image sensor 102 then sends image data in suitable form to monitoring unit 106.

Figure 2:
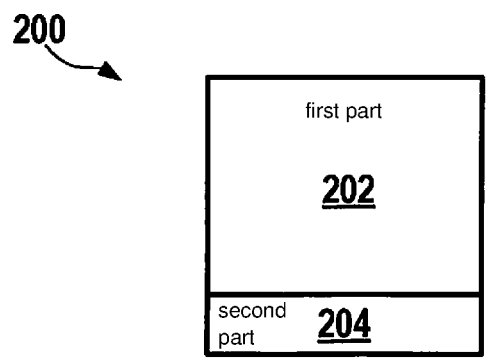
FIG. 2 shows a schematic representation of an image generated by an image sensor according to one exemplary embodiment.

According to one exemplary embodiment, the image data are such that an overall image is made up of an image content and a test pattern, as shown in FIG. 2. In this instance, the test pattern uses a few lines or columns of the overall image, for example.

Image sensor 102 receives a challenge in the form of request signal 108 via the communication system. The challenge is evaluated in image sensor 102, that is, is first of all recognized as challenge. In so doing, that part of the challenge which relates to the modification of the test pattern is identified in the appropriate component of image sensor 102 and passed on to a further component for generating the modified test pattern, the further component generating the test pattern modified by the challenge. In the responsible component, a default method is carried out for that purpose, for example, with which a test pattern is generated in any case, even if no challenge is present. The modified test pattern is then passed on to a component for transmitting the modified test pattern. In so doing, the modified test pattern is either sent separately, e.g., as a stand-alone image, or embedded into a structure, as shown in FIG. 2, for instance. In this structure, the modified test pattern is part of an image.

In this context, it is especially efficient if the image, and therefore also the image portion representing the modified test pattern, is transmitted in pieces, e.g., in lines. Analogous to that, it is advantageous if the modified test pattern is likewise generated in a corresponding piece size, e.g., line by line, so that substantial temporary storage may be omitted. At the same time, the generating of the modified test pattern should be synchronized with the transmission of the image in such a way that the respective pieces are delivered in the transmitting clock pulse of the image.

FIG. 2 shows a schematic representation of an image 200 generated by an image sensor according to one exemplary embodiment. For example, image 200 was generated by an image sensor as described above with reference to FIG. 1. According to this exemplary embodiment, the image includes a first part 202 that represents an actual image content, as well as a second part 204 that represents a test pattern in the form of one or more columns or lines of image 200. Second part 204 in the form of the test pattern is modified by image sensor 102, for example, using the request signal in order to obtain the modified test pattern. Depending on the exemplary embodiment, the modified test pattern in the form of the reply signal is transmitted either separately, or again as part of a composite image, similar to the image shown in FIG. 2, to the monitoring unit.

Figure 3:
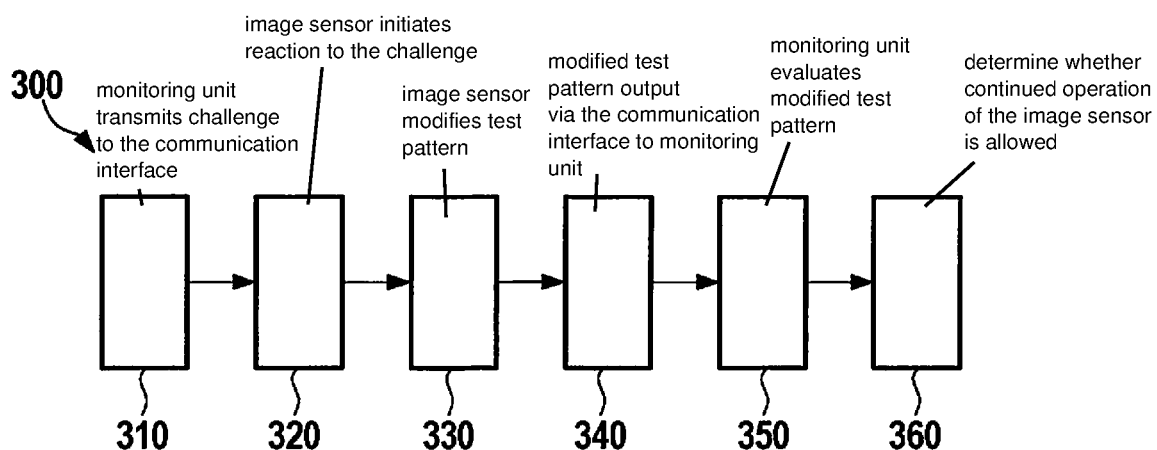
FIG. 3 shows a flowchart of a method according to one exemplary embodiment.

FIG. 3 shows a flowchart of a method 300 according to one exemplary embodiment. Method 300 for monitoring an image sensor may be carried out, e.g., using a device as described above on the basis of FIGS. 1 and 2. A basic sequence of method 300 is shown by way of example in FIG. 3. In the process, in a step 310, the monitoring unit transmits a challenge in the form of the request signal to the communication interface of the image sensor, which reads in the request signal via the communication interface. The challenge represented by the request signal is not known to the image sensor. However, the manner in which to react to any challenge at all is stored in the image sensor. Thus, in a further step 320, the image sensor initiates the reaction to the challenge. In a step 330, the image sensor modifies the test pattern on the basis of the challenge, the modified test pattern being sent along, e.g., as reaction to the challenge, in an image. In this context, the modification of the test pattern is implemented in virtually any form, perhaps by a simple cyclic shift of the test pattern by a value calculated from the challenge, by replacing or exchanging a few lines or rows of the test pattern or by exchanging the test pattern for a completely different test pattern. It is efficient if no extensive hardware is necessary to create the new test pattern. This new test pattern should be known to the monitoring unit, at least in principle. In a step 340, the modified test pattern is output via the communication interface to the monitoring unit, the monitoring unit checking in a step 350 by evaluating the modified test pattern, whether the modified test pattern meets its expectations. Finally, in a step 360, depending on the result of step 350, it is decided whether the continued operation of the image sensor is allowed or whether a fault is present. For example, the image sensor is deactivated in step 360 if the modified test pattern was recognized repeatedly as incorrect in step 350.

Method 300 may be referred to as a challenge/response method or query/reply method for monitoring electronic components, especially also for mutual monitoring, for example. Method 300 is characterized in that the monitoring unit sends a challenge or query, usually a suitable bit pattern, to the image sensor, and based on this query, the image sensor carries out internal measures such as calculations which lead, inter alia, to the generation of a response or reply. This reply is sent back to the monitoring unit which is able to check the correctness of the reply, since it knows or is able to generate the only correct reply.

In order to implement step 330 efficiently, it is advantageous, for example, if the bit pattern of the test pattern is generated sequentially, for instance, line by line or word by word, as output of a logic, and is not read out from a memory. As an example, this logic is a state machine which generates a new value, say a new line, every x clock cycles. Depending on the exemplary embodiment, the logic needs only one seed value which is taken directly from the challenge, for example, and thereupon generates an ever continuing succession of values right up to lines. For example, the predecessor value or the predecessor line is then the start value of the next value or the next line. Consequently, only the logic, the seed value and the number of the lines are necessary to generate a complete test pattern.

It is particularly advantageous if the challenge is synchronized with the sending of images. For example, the challenge is transmitted precisely in such a way that the next or the next but one (or the next but two, etc.) set of image data includes a corresponding change of the test-pattern data. This is accomplished, for instance, by transmitting the challenge with a fixed time interval from the last image or prior to the next image. A variable interval with a limitation of the variability to a defined time interval may also represent such a synchronization. Such a timewise coupling or synchronization also makes it possible to use the image sensor to a limited extent for monitoring the monitoring unit: If no challenge comes within the anticipated time window or if a challenge is not legal, that is, does not satisfy easily checkable criteria, then an error reaction is initiated, for example, by the image sensor.

Alternatively, for each image or for each nth image, a corresponding challenge is sent. This is particularly useful if a relatively great amount of time is required within the image sensor to generate the test pattern modified according to the challenge.

According to a further exemplary embodiment, method 300 is expanded by the generation of an additional response that is also included, over and above the change of the test pattern. To that end, besides the modified test pattern, the image sensor transmits at least one other explicit message to the monitoring unit. For example, it is beneficial if one message is sent per challenge, perhaps within a fixed time interval after the challenge. This permits easy monitoring as to time within the monitoring unit, that is, a simple check as to whether the response is delivered at the correct time.

In addition, it is advantageous if a content of the response is linked to the challenge in such a way that safety and monitoring mechanisms within the image sensor are tied into the generation of the response, and therefore the monitoring unit also receives evidence from the response about whether the safety and monitoring mechanisms within the image sensor are active and have found no fault. For example, this is accomplished in a form as described in greater detail below with reference to FIG. 5.

Optionally, a debounce mechanism is integrated into challenge-based method 300 so that, for example, a false test-pattern generation or response does not lead immediately to a firm shutdown of the image sensor. Instead, a shutdown is only initiated after two or three incorrect test patterns or responses, for example. This has the advantage that a test may also be performed during operation, for instance, by now and then intentionally transmitting a false result.

Figure 4:
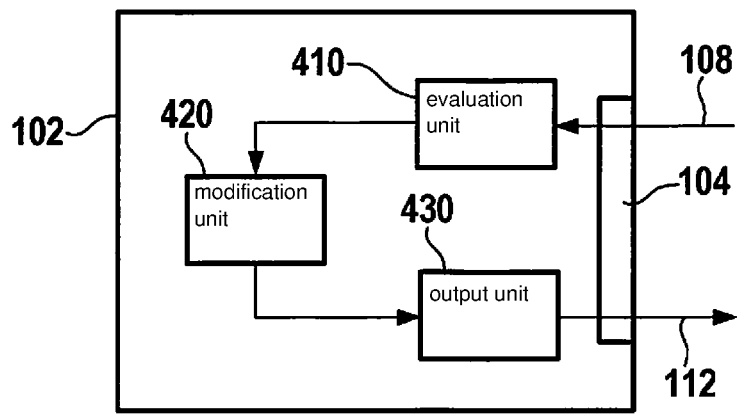
FIG. 4 shows a schematic representation of an image sensor according to one exemplary embodiment.

In order to implement method 300, for example, an image sensor is used having the components shown in FIG. 4.

FIG. 4 shows a schematic representation of an image sensor 102 according to one exemplary embodiment, for instance, an image sensor described above with the aid of FIGS. 1 through 3. Image sensor 102 includes communication interface 104 for reading in request signal 108, which is evaluated by an evaluation unit 410 in order to initiate the reaction to the challenge represented by request signal 108. A modification unit 420 is designed, in response to the initiation of the reaction, to generate the modified test pattern in the form of reply signal 112. An output unit 430 is designed to in turn transmit reply signal 112 via communication interface 104.

Figure 5:
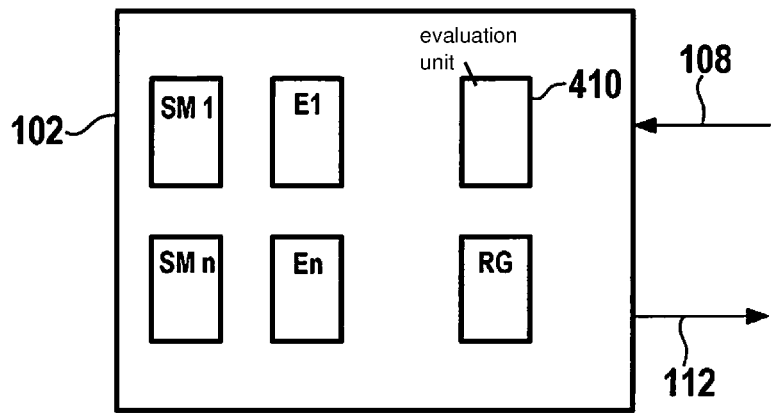
FIG. 5 shows a schematic representation of an image sensor according to one exemplary embodiment.

FIG. 5 shows a schematic representation of an image sensor 102 according to one exemplary embodiment. In contrast to FIG. 4, image sensor 102 according to this exemplary embodiment is realized with a plurality of safety mechanisms SM1 to SMn, as well as a response-generating unit RG. In this instance, response-generating unit RG is designed to generate reply signal 112, using results provided by the safety mechanisms.

For example, safety and monitoring mechanisms SM1 to SMn are implemented in such a form that they supply one result E1 to En each. In the case of a cyclic test, this is achieved for instance, in that one respective test result, "pass" or "fail," is part of the result, e.g., of test data used, of a counter or of a timestamp. In the case of a software plausibility check running quasi-continuously, it may be a succession of patterns expected in the code, which are written into a memory, or only an ascertainment of a sequence of steps which occur in the procedure, the test being regarded as passed if the sequence is recognized as "correct." Any safety mechanism may be integrated which is able to be implemented in such a way that it supplies a result representable in the memory. It is just crucial that the result of the safety mechanism is a function of the challenge.

In the simplest case, this is accomplished in that an initially supplied result is also modified with the challenge, for instance, via XOR. In this instance, however, a freeze-up of the initially supplied result cannot be recognized. For example, in the case of a test, the test data used or a sequence of test data or partial tests are influenced by the challenge, depending on the specific safety mechanism. In the case of software, for example, internal (counter-) variables, which are taken into account in the result, are influenced. Evaluation unit 410 is designed to identify that part of the challenge which is valid for the respective safety mechanisms, and to make the safety mechanism available in suitable form. In response-generating unit RG, the various results E1 to En are then combined, possibly compressed and made available to the monitoring unit. This ensures that a fault detected by an internal safety mechanism expresses itself in a correspondingly "false" response. The response anticipated with respect to a challenge is known to the monitoring unit. In the event of a disparity between the anticipated response and the received response, an error reaction is initiated by the monitoring unit, for example.

According to one exemplary embodiment, the challenge is also tied in by response-generating unit RG itself, e.g., by taking a challenge-dependent sequence, selection or linkage form into account when binding the various results E1 to En together.

Figure 6:
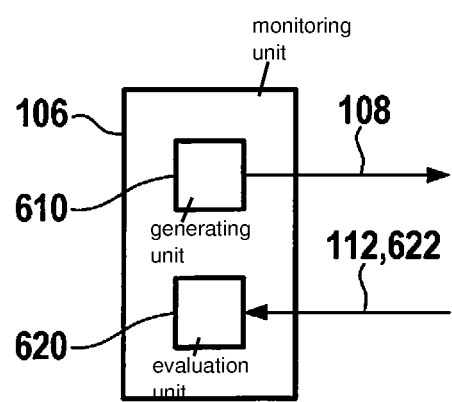
FIG. 6 shows a schematic representation of a monitoring unit according to one exemplary embodiment.

FIG. 6 shows a schematic representation of a monitoring unit 106 according to one exemplary embodiment, for instance, a monitoring unit described above with the aid of FIGS. 1 through 5. According to this exemplary embodiment, monitoring unit 106 includes a generating unit 610 which is designed to generate request signal 108 subject to an image-transmitting clock pulse of the image sensor, particularly synchronously with the image-transmitting clock pulse, for instance, and to transmit it to the communication interface of the image sensor. In addition, monitoring unit 106 includes an evaluation unit 620, which is adapted to evaluate the modified test pattern, using reply signal 112. For example, evaluation unit 620 is designed to deactivate the image sensor if the evaluation of the modified test pattern shows repeatedly that the modified test pattern is incorrect, that is, does not match the test pattern known to monitoring unit 106.

Optionally, in addition to evaluating reply signal 112, evaluation unit 620 is designed to evaluate at least one further reply signal 622 output by the image sensor using request signal 108, in order to check the operational capability of the image sensor. For instance, further reply signal 622 represents a signal generated using at least one safety mechanism of the image sensor.

According to a further exemplary embodiment, evaluation unit 620 is designed to check an operational capability of monitoring unit 106, using reply signal 112. To that end, for instance, an algorithm which runs on a normal image is also executed on the test patterns. Since the results on the test patterns are known, this may also be used to check the hardware on which the corresponding algorithms run.

If an exemplary embodiment includes an "and/or" link between a first feature and a second feature, this is to be read in such a way that the exemplary embodiment according to one specific embodiment has both the first feature and the second feature, and according to a further specific embodiment, has either only the first feature or only the second feature.

What is claimed is:

1. A method for monitoring an image sensor, the image sensor having a communication interface configured for communicating with an external monitoring unit, the method comprising:
   reading-in a request signal, generated by the monitoring unit, via the communication interface;
   modifying a test pattern, generated by the image sensor, using the request signal, to obtain a modified test pattern; and
   outputting the modified test pattern to the communication interface, to have the modified test pattern evaluated by the monitoring unit;
   wherein using the request signal, at least one further reply signal is output in the outputting step to have the further reply signal evaluated by the monitoring unit.

2. The method as recited in claim 1, wherein in the outputting step, the modified test pattern is output as part of an image generated by the image sensor.

3. The method as recited in claim 1, wherein in the modifying step, the modified test pattern is generated piece by piece, pieces of the modified test pattern being output in the output step.

4. The method as recited in claim 1, wherein in the modifying step, the modified test pattern is generated sequentially starting from a start value, using a processing specification.

5. The method as recited in claim 1, further comprising:
generating the request signal, subject to an image-transmitting clock pulse of the image sensor.

6. The method as recited in claim 5, wherein in the generating step, the request signal is generated synchronously with an image-transmitting clock pulse.

7. The method as recited in claim 1, further comprising:
evaluating the modified test pattern, the image sensor being deactivated in a deactivation step if the modified test pattern is recognized repeatedly as incorrect during the evaluation.

8. The method as recited in claim 1, wherein in the outputting step, the further reply signal is output using at least one safety mechanism of the image sensor.

9. The method as recited in claim 1, further comprising:
checking an operational capability of the monitoring unit, using the modified test pattern.

10. A device having units configured for monitoring an image sensor, the image sensor having a communication interface configured for communicating with an external monitoring unit, the device configured to:

read-in a request signal, generated by the monitoring unit, via the communication interface;

modify a test pattern, generated by the image sensor, using the request signal, to obtain a modified test pattern; and output the modified test pattern to the communication interface, to have the modified test pattern evaluated by the monitoring unit;

wherein using the request signal, at least one further reply signal is output to the communication interface to have the further reply signal evaluated by the monitoring unit.

11. A non-transitory machine-readable storage medium on which is stored a computer program for monitoring an image sensor, the image sensor having a communication interface configured for communicating with an external monitoring unit, the method computer program, when executed by a computer, causing the computer to perform:

reading-in a request signal, generated by the monitoring unit, via the communication interface;

modifying a test pattern, generated by the image sensor, using the request signal, to obtain a modified test pattern; and outputting the modified test pattern to the communication interface, to have the modified test pattern evaluated by the monitoring unit;

wherein using the request signal, at least one further reply signal is output in the outputting step to have the further reply signal evaluated by the monitoring unit.

* * * * *